US011495170B2

(12) United States Patent
Kim et al.

(10) Patent No.: US 11,495,170 B2
(45) Date of Patent: Nov. 8, 2022

(54) LED DISPLAY MODULE, MANUFACTURING METHOD FOR LED DISPLAY MODULE AND DISPLAY DEVICE INCLUDING LED DISPLAY MODULE

(71) Applicant: SAMSUNG ELECTRONICS CO., LTD., Suwon-si (KR)

(72) Inventors: Myunghee Kim, Suwon-si (KR); Jenghun Suh, Suwon-si (KR); Jaephil Shim, Suwon-si (KR); Jihoon Kang, Suwon-si (KR); Jitsuo Ota, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 16/864,702

(22) Filed: May 1, 2020

(65) Prior Publication Data

US 2020/0349882 A1 Nov. 5, 2020

(30) Foreign Application Priority Data

May 3, 2019 (KR) .................. 10-2019-0052554

(51) Int. Cl.
*G09G 3/32* (2016.01)
*H01L 51/50* (2006.01)
(Continued)

(52) U.S. Cl.
CPC ............. *G09G 3/32* (2013.01); *G09G 3/2003* (2013.01); *H01L 33/0075* (2013.01);
(Continued)

(58) Field of Classification Search
None
See application file for complete search history.

(56) References Cited

U.S. PATENT DOCUMENTS 6,961,993 B2  11/2005  Oohata
8,507,357 B2  8/2013  Lin et al.
(Continued)

FOREIGN PATENT DOCUMENTS

CN   102237471 A  * 11/2011
CN   102117869 B    12/2013
(Continued)

OTHER PUBLICATIONS

M. H. Kim et al., "AlGaN-Based Deep Ultraviolet Light Emitting Diodes Fabricated on Patterned Sapphire Substrate", Applied Physics Express, vol. 4, No. 092102, Sep. 2011, 4 pages.
(Continued)

*Primary Examiner* — Kirk W Hermann
(74) *Attorney, Agent, or Firm* — Sughrue Mion, PLLC

(57) ABSTRACT

A display panel including an LED device and a method including: forming a plurality of light emitting diodes (LEDs); and forming a plurality of partition walls that divide light-emitting regions by each of the plurality of LEDs, wherein the forming the plurality of LEDs includes: etching a growth substrate to form a plurality of LEDs and forming a plurality of protrusions and a plurality of depressions on the growth substrate; and forming a reflector layer on a surface of the plurality of protrusions and a surface of the plurality of depressions, and wherein the forming the plurality of partition walls includes removing a part of the growth substrate so that the plurality of partition walls are formed based on the plurality of protrusions, and a space between the plurality of partition walls is formed based on the plurality of depressions.

17 Claims, 23 Drawing Sheets

(51) Int. Cl.
G09G 3/20 (2006.01)
H01L 51/52 (2006.01)
H01L 33/00 (2010.01)

(52) U.S. Cl.
CPC ........ *H01L 51/502* (2013.01); *H01L 51/5271* (2013.01); *G09G 2300/0452* (2013.01); *H01L 2251/301* (2013.01)

(56) References Cited

U.S. PATENT DOCUMENTS

| | | | |
|---|---|---|---|
| 9,263,255 | B2 | 2/2016 | Heo et al. |
| 9,599,857 | B2 | 3/2017 | Bibi et al. |
| 9,865,577 | B2 | 1/2018 | Bibi et al. |
| 2007/0103386 | A1* | 5/2007 | Hara ................ G02F 1/133308 345/1.1 |
| 2013/0330853 | A1* | 12/2013 | Tischler ................ H01L 33/50 438/27 |
| 2017/0229429 | A1 | 8/2017 | He et al. |
| 2017/0250316 | A1 | 8/2017 | Yeon et al. |
| 2017/0250329 | A1 | 8/2017 | Takeya et al. |
| 2017/0294479 | A1* | 10/2017 | Cha ..................... H01L 33/0095 |
| 2018/0047880 | A1* | 2/2018 | Li ........................... H01L 33/58 |
| 2018/0090058 | A1* | 3/2018 | Chen ................... H01L 25/0753 |
| 2018/0166424 | A1 | 6/2018 | Sim et al. |
| 2018/0182275 | A1 | 6/2018 | Ahmed et al. |
| 2018/0374831 | A1 | 12/2018 | Sakariya et al. |
| 2019/0098764 | A1 | 3/2019 | Li et al. |
| 2020/0343410 | A1* | 10/2020 | Iguchi .................. H01L 33/405 |

FOREIGN PATENT DOCUMENTS

| | | |
|---|---|---|
| JP | 6429626 B2 | 11/2018 |
| KR | 10-1012638 B1 | 2/2011 |
| KR | 10-2014-0071161 A | 6/2014 |
| KR | 10-1913903 B1 | 10/2018 |
| WO | 2013/036589 A1 | 3/2013 |

OTHER PUBLICATIONS

Kentaro Nagamatsu et al., "High-efficiency AlGaN-based UV light-emitting diode on laterally overgrowth AlN", Journal of Crystal Growth, vol. 310, Jan. 8, 2008, pp. 2326-2329.

M. Imura et al., "Microstructure of thick AlN grown on sapphire by high-temperature MOVPE", physics status solidi (a) vol. 203, No. 7, 2006, pp. 1626-1631.

J. Mei et al., "Dislocation generation at the coalescence of aluminum nitride lateral epitaxy on shallow-grooved sapphire substrates", Applied Physics Letters vol. 90, No. 221909, May 31, 2007, 4 pages.

M. Imura et al., "Microstructure of epitaxial lateral overgrown AlN on trench-patterned AlN template by high-temperature metal-organic vapor phase epitaxy", Applied Physics Letters, vol. 89, No. 221901, Nov. 27, 2006, 3 pages.

Masataka Imura et al., "Epitaxial lateral overgrowth of AlN on trench-patterned AlN layers", Journal of Crystal Growth vol. 298, Nov. 20, 2006, pp. 257-260.

Kiho Yamada et al., "Development of underfilling and encapsulation for deep-ultraviolet LEDs", Applied Physics Express, vol. 8, No. 012101, Dec. 5, 2014, 3 pages.

Michiko Kaneda et al., "Uneven AlGaN multiple quantum well for deep-ultraviolet LEDs grown on macrosteps and impact on electroluminescence spectral output", Japanese Journal of Applied Physics, vol. 56, No. 061002, May 26, 2017, 9 pages.

Y. A. Xi et al., "Very high quality aln grown on (0001) sapphire by metalorganic vapor phase epitaxy", Applied Physics Letters vol. 89, No. 103106, Sep. 6, 2006, 3 pages.

T. Kinoshita et al., "Deep-Ultraviolet Light-Emitting Diodes Fabricated on AlN Substrates Prepared by Hydride Vapor Phase Epitaxy", Applied Physics Express, vol. 5, No. 122101, Nov. 14, 2012, 3 pages.

Communication dated Nov. 3, 2021, from the European Patent Office in European Application No. 20802673.2.

Communication dated Aug. 18, 2020, issued by the International Searching Authority in counterpart International Application No. PCT/KR2020/005719 (PCT/ISA/210 and PCT/ISA/237).

* cited by examiner

111: Micro LED in flip-chip type

113: Partition wall of predetermined height, including Silicon

114: Reflector layer including at least one of Al and AlN or multi-layer including first reflector layer including Al, second reflector layer including AlN, and third reflector layer including Al

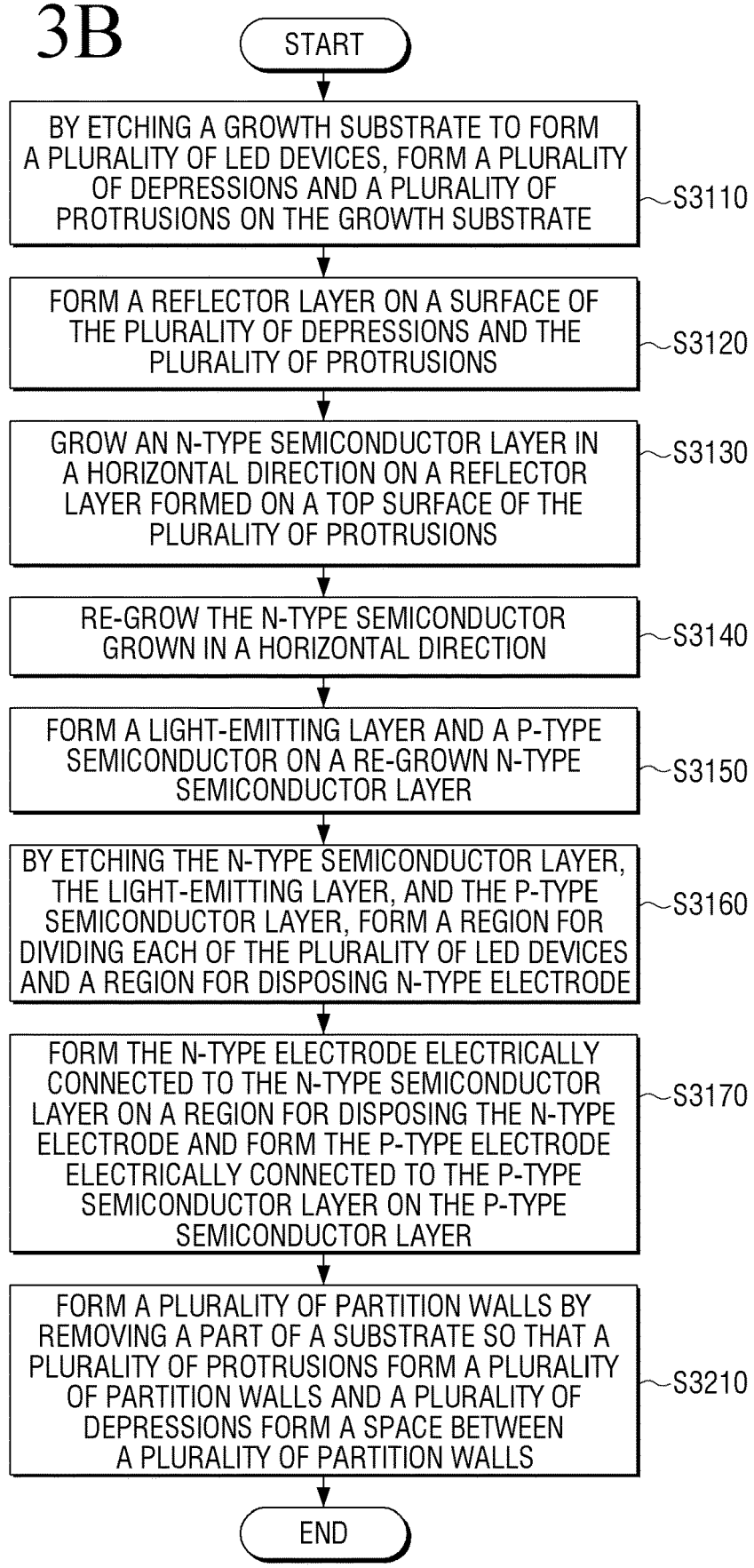

LED DISPLAY MODULE, MANUFACTURING METHOD FOR LED DISPLAY MODULE AND DISPLAY DEVICE INCLUDING LED DISPLAY MODULE

CROSS-REFERENCE TO RELATED APPLICATION(S)

This application is based on and claims priority under 35 U.S.C. § 119 to Korean Patent Application No. 10-2019-0052554, filed on May 3, 2019, in the Korean Intellectual Property Office, the disclosure of which is incorporated by reference herein in its entirety.

BACKGROUND

1. Field

The disclosure relates to a light emitting diode (LED) display module, a method for manufacturing the LED display module, and a display device including the LED display module. More particularly, the disclosure relates to a plurality of partition walls and a reflector layer formed on a side of the plurality of partition walls, a method for manufacturing the LED display module, and a display device including an LED display module.

2. Description of Related Art

Recently, a semiconductor-based light emitting diode (LED) has been used in various industries such as display applications because of its high light-emitting efficiency and long lifespan. A micro LED device has attracted much attention as a light source that forms individual pixel elements in a related art display device.

In a manufacturing process of an LED display panel, there is an issue associated with characteristic improvement of a partition wall separating light emitting regions of the LED device and efficiency of the manufacturing method thereof, together with issues such as the improvement of light-emitting efficiency, and the precision and efficiency of a transfer process.

When a partition wall is manufactured by photolithography using a photo-resin, there is a limit on the rigidity of a partition wall against a weight load and external pressure that may be generated in the manufacturing process of the display panel. Further, it is difficult to expect a reflection effect on the light emitted from the LED device. In addition, there is an increasing demand to simplify and ease a partition wall manufacturing process.

Meanwhile, a micro LED (mLED or µLED) display panel is a kind of flat display panel and may consist of a plurality of inorganic light emitting diodes (inorganic LEDs), each of which is in a size of smaller than 100 micrometers. Compared to a liquid crystal display (LCD) panel which needs a backlight, a micro LED display panel provides better contrast, response time, and energy efficiency. Also, while both of an organic light emitting diode (organic LED) and a micro LED have good energy efficiency, a micro LED has an advantage that it has better brightness and light emitting efficiency, and a longer lifespan than an OLED.

SUMMARY

The disclosure provides a display module including a high-performance partition wall, a display device, and an efficient method for manufacturing the display module including a high-performance partition wall.

Additional aspects will be set forth in part in the description which follows and, in part, will be apparent from the description or may be learned by practice of the presented embodiments.

In accordance with an aspect of the disclosure, a display module including: a plurality of light-emitting diodes (LEDs); a driving substrate; a driving circuit on an upper portion of the driving substrate and configured to drive the plurality of LEDs; a plurality of partition walls configured to divide light-emitting regions by each of the plurality of LEDs; and reflective layers formed on both sides of each of the plurality of partition walls.

Each of the plurality of partition walls may be a part of a plurality of protrusions formed by etching of a growth substrate to form the plurality of LEDs; and the plurality of protrusions may be formed before a plurality of semiconductor layers included in the plurality of LEDs is formed on the growth substrate.

Each of the plurality of partition walls may be formed to have a predetermined height so that wavelengths of light emitted from each of the plurality of LEDs do not overlap each other.

A width of each of the plurality of partition walls may narrow as a height increases toward an upper portion.

The display module may further include: a plurality of pixels in a matrix form, wherein the plurality of pixels may each include a red (R) sub pixel, a green (G) sub pixel, and a blue (B) sub pixel, and wherein the R-sub pixel, the G-sub pixel, and the B-sub pixel may each correspond to one LED device among the plurality of LEDs.

The display module may further include: a color conversion layer at a space between the plurality of partition walls, wherein the space between the plurality of partition walls may be formed based on a plurality of depressions formed along with the plurality of protrusions on the growth substrate, and wherein the color conversion layer may include a quantum dot (QD) or phosphor.

Each of the plurality of partition walls may include silicon.

The reflector layer may include at least one of aluminum (Al) and aluminum nitride (AlN).

The reflector layer may include: a first reflector layer including aluminum; a second reflector layer on the first reflector layer and including aluminum nitride; and a third reflector layer on the second reflector layer and including aluminum.

Each of the plurality of LEDs may be a micro LED device in a flip-chip type.

In accordance with another aspect of the disclosure, a method for manufacturing a display module includes: forming a plurality of light emitting diodes (LEDs); and forming a plurality of partition walls that divide light-emitting regions by each of the plurality of LEDs, wherein the forming the plurality of LEDs includes: etching a growth substrate to form a plurality of LEDs and forming a plurality of protrusions and a plurality of depressions on the growth substrate; and forming a reflector layer on a surface of the plurality of protrusions and a surface of the plurality of depressions, and wherein the forming the plurality of partition walls includes removing a part of the growth substrate so that the plurality of partition walls are formed based on the plurality of protrusions, and a space between the plurality of partition walls is formed based on the plurality of depressions.

The forming the plurality of LEDs may further include: growing an n-type semiconductor layer on the reflector layer formed on a top surface of the plurality of protrusions in a horizontal direction; re-growing the n-type semiconductor layer grown in the horizontal direction; forming a light-emitting layer and a p-type semiconductor layer on the regrown n-type semiconductor layer; forming a region for dividing each of the plurality of LEDs and a region for disposing an n-type electrode by etching the n-type semiconductor layer, the light-emitting layer, and the p-type semiconductor layer; and forming the n-type electrode electrically connected to the n-type semiconductor layer on a region to dispose the n-type electrode, and forming, on the p-type semiconductor, the p-type electrode electrically connected to the p-type semiconductor.

Each of the plurality of partition walls are formed to have a predetermined height so that wavelengths of light emitted from each of the plurality of LEDs do not overlap each other.

A width of each of the plurality of partition walls may narrow as a height approaches toward an upper portion.

Each of the plurality of partition walls may include silicon.

The reflector layer may include at least one of aluminum (Al) and aluminum nitride (AlN).

The method may further include: forming a color conversion layer at a space between the plurality of partition walls, wherein the color conversion layer may include a quantum dot (QD) or phosphor.

In accordance with another aspect of the disclosure, a display device includes: a plurality of display modules; and a support plate configured to support the plurality of display modules, wherein each of the plurality of display modules includes: a plurality of light-emitting diodes (LEDs); a driving substrate; a driving circuit on an upper portion of the driving substrate and configured to drive the plurality of LEDs; a plurality of partition walls configured to divide light-emitting regions by each of the plurality of LEDs; and reflective layers formed on both sides of each of the plurality of partition walls.

Each of the plurality of partition walls may be a part of a plurality of protrusions formed by etching of a growth substrate to form the plurality of LEDs; and the plurality of protrusions may be formed before a plurality of semiconductor layers included in the plurality of LEDs is formed on the growth substrate.

The display module may further include a plurality of pixels in a matrix form, the plurality of pixels may each include a red (R) sub pixel, a green (G) sub pixel, and a blue (B) sub pixel, and the R-sub pixel, the G-sub pixel, and the B-sub pixel may each correspond to one LED device among the plurality of LEDs.

In accordance with another aspect of the disclosure, a display module includes: a plurality of light-emitting diodes (LEDs); a plurality of partition walls configured to divide light-emitting regions by each of the plurality of LEDs; and reflective layers formed on both sides of each of the plurality of partition walls, wherein, for each of the plurality of partition walls, an angle between a lower surface of the partition wall and an outer surface of the reflective layers is less than 90 degrees.

Each of the plurality of partition walls may be a part of a plurality of protrusions formed by etching of a growth substrate to form the plurality of LEDs; and the plurality of protrusions may be formed before a plurality of semiconductor layers included in the plurality of LEDs is formed on the growth substrate.

Each of the plurality of partition walls may be formed to have a predetermined height so that wavelengths of light emitted from each of the plurality of LEDs do not overlap each other.

A width of each of the plurality of partition walls may narrow as a height increases toward an upper portion.

The angle may be greater than 45 degrees.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3B is a flowchart illustrating each operation of FIG. 3A in greater detail;

DETAILED DESCRIPTION

Figure 1:
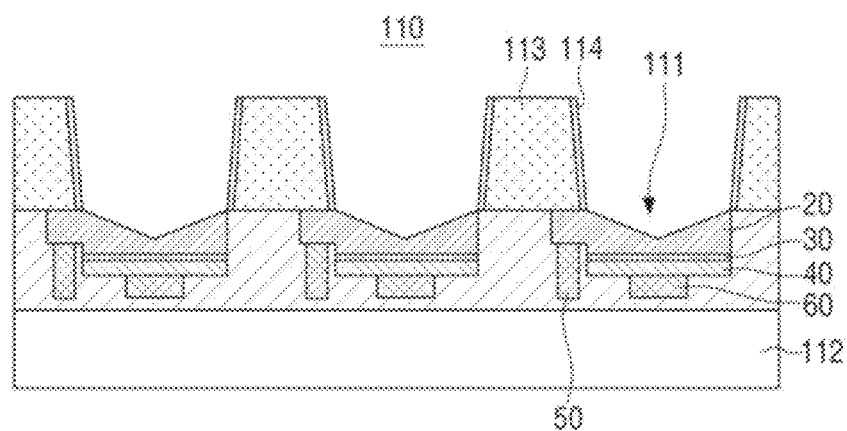
FIG. 1 is a cross-sectional diagram briefly illustrating a structure of a display module according to an embodiment.

Hereinafter, embodiments of the disclosure will be described with reference to the accompanying drawings. However, it may be understood that the disclosure is not limited to the embodiments described hereinafter, but also includes various modifications, equivalents, and/or alternatives of these embodiments. In relation to explanation of the drawings, similar drawing reference numerals may be used for similar constituent elements.

In the following description, a detailed description of the related art may be omitted when it is determined that such description may obscure the gist of the disclosure.

In addition, the following embodiments may be combined and modified in many different forms, and the scope of the technical spirit of the disclosure is not limited to the following examples. Rather, these embodiments are provided so that this disclosure will be thorough and complete, and will fully convey the technical spirit to those skilled in the art.

The terms used herein are to describe certain embodiments and are not intended to limit the scope of claims. A singular expression includes a plural expression unless otherwise specified.

In this specification, expressions such as "have," "may have," "include," "may include" or the like represent presence of a corresponding feature (for example, components such as numbers, functions, operations, or parts) and does not exclude the presence of additional feature.

In this document, expressions such as "at least one of A [and/or] B," or "one or more of A [and/or] B," include all possible combinations of the listed items. For example, "at least one of A and B," or "at least one of A or B" includes any of (1) at least one A, (2) at least one B, or (3) at least one A and at least one B.

As used herein, the terms "first," "second," or the like may denote various components, regardless of order and/or importance, and may be used to distinguish one component from another, and does not otherwise limit the components.

If it is described that a certain element (e.g., first element) is "operatively or communicatively coupled with/to" or is "connected to" another element (e.g., second element), it should be understood that the certain element may be connected to the other element directly or through still another element (e.g., third element).

On the other hand, if it is described that a certain element (e.g., first element) is "directly coupled to" or "directly connected to" another element (e.g., second element), it may be understood that there is no element (e.g., third element) between the certain element and the another element.

The term "planar" in the disclosure means that no processing is performed during the formation of nonconductor/semiconductor/conductor layers, and the term "non-planar" means that the surface treatment is performed such that the surface area becomes greater than the "planar" during formation of the nonconductive/semiconductor/conductor layers. The "non-planar" is not limited to a particular type.

Also, the expression "configured to" used in the disclosure may be interchangeably used with other expressions such as "suitable for," "having the capacity to," "designed to," "adapted to," "made to," and "capable of," depending on cases. Meanwhile, the term "configured to" does not necessarily mean that a device is "specifically designed to" in terms of hardware.

Instead, under some circumstances, the expression "a device configured to" may mean that the device "is capable of" performing an operation together with another device or component. For example, the phrase "a processor configured to perform A, B, and C" may mean a dedicated processor (e.g., an embedded processor) for performing the corresponding operations, or a generic-purpose processor (e.g., a central processing unit (CPU) or an application processor) that can perform the corresponding operations by executing one or more software programs stored in a memory device.

The display device according to various embodiments may include, for example, a television, a monitor, a smartphone, a tablet personal computer (PC), a wearable device, a portable multimedia player, a digital camera, a portable device, or the like.

It is understood that various elements and regions in the figures are shown out of scale. Accordingly, the scope of the disclosure is not limited by the relative sizes or spacing drawn from the accompanying drawings.

Hereinafter, with reference to the attached drawings, embodiments will be described in detail so that those skilled in the art to which the disclosure belongs to can easily make and use the embodiments.

FIG. 1 is a cross-sectional diagram briefly illustrating a structure of a display module 110 according to an embodiment.

FIG.1 includes a plurality of the same or substantially similar configurations and redundant reference numbers of the same components are omitted.

As illustrated in FIG. 1, the display module 110 according to an embodiment includes a plurality of light emitting diodes (LEDs) 111, a plurality of partition walls 113, and a reflector layer 114. Each of the plurality of LEDs 111 includes a plurality of semiconductor layers, an n-type electrode 50, and a p-type electrode 60. Further, the plurality of semiconductor layers includes an n-type semiconductor layer 20, a p-type semiconductor layer 40, and a light-emitting layer 30.

The n-type semiconductor layer 20 and the p-type semiconductor layer 40 may be formed of a compound semiconductor such as a III-V group, a II-VI group, or the like. The n-type semiconductor layer 20 and the p-type semiconductor layer 40 may be formed of a nitride semiconductor layer. For example, the n-type semiconductor layer 20 may be an n-gallium nitride (GaN) semiconductor layer and the p-type semiconductor layer 40 may be a p-GaN semiconductor layer, although it is understood that one or more other embodiments are not limited thereto. That is, the n-type semiconductor layer 20 and the p-type semiconductor layer 40 may be made of various materials depending on the various characteristics required, designed, or used for the LED device 111.

The n-type semiconductor is a semiconductor in which free electrons are used as a carrier for relocating charges, and may be formed by doping an n-type dopant such as Si, Ge, Sn, Te, or the like. The p-type semiconductor is a semiconductor in which a hole is used as a carrier for relocating charges and may be formed by doping a p-type dopant such as Mg, Zn, Ca, Ba, or the like.

The light-emitting layer 30, the n-type semiconductor layer 20, and the p-type semiconductor layer 40 may be formed of various semiconductors having a band gap corresponding to a specific region within the spectrum. For example, a red LED device 111 having a light wavelength of 600-750 nm may include one or more layers based on an AlInGaP-based semiconductor. A blue LED device 111 having a light wavelength of 450-490 nm and a green LED device 111 having a light wavelength of 500-570 nm may each include one or more layers based on an AlInGaN-based semiconductor.

The light-emitting layer 30 is disposed between the n-type semiconductor layer 20 and the p-type semiconductor layer 40, and is a layer in which an electron that is a carrier of the n-type semiconductor layer 20 and a hole that is a carrier of the p-type semiconductor layer 40 meet. When (or based on) the electron and hole meet in the light-emitting layer 30, a potential barrier is formed as the electron and hole are recombined. When (or based on) the electron and hole transition beyond a potential barrier to a low energy level according to an applied voltage, light of a corresponding wavelength is emitted.

The light-emitting layer 30 may have a multi-quantum wells (MQW) structure, although it is understood that one or more other embodiments are not limited thereto. For example, according to one or more other embodiments, the light-emitting layer 30 may have a variety of structures, such as a single quantum well (SQW) structure or a quantum dot (QD) structure. If the light-emitting layer 30 is formed in a MQW structure, the well layer/barrier layer of the light-emitting layer 30 may be formed in the same structure as, but not limited to, InGaN/GaN, InGaN/InGaN, GaAs(InGaGs)/AlGaAs, or the like. The number of quantum wells included in the light-emitting layer 30 is also not limited to a particular number.

In FIG. 1, it is illustrated that the light-emitting layer 30 is formed on the n-type semiconductor layer 20 and the p-type semiconductor layer 40 is formed on the light-emitting layer 30. It is understood, however, that it is also possible that the light-emitting layer 30 is formed on the p-type semiconductor layer 40 and the n-type semiconductor layer 20 is formed on the light-emitting layer 30.

The plurality of partition walls 113 serve to distinguish the light-emitting regions for each of the plurality of LEDs 111, and a structure including the plurality of partition walls 113 may be referred to as a so-called rib-structure. Specifically, each of the plurality of partition walls 113 may be formed to have a predetermined height so that the wavelengths of light emitted by each of the plurality of LED device 111 do not overlap with each other. For example, when the color conversion layer formed in the space between the plurality of partition walls 113 includes a quantum dot (QD), each of the plurality of partition walls 113 may be formed to have a height of 3 μm or more. As described below, when the color conversion layer formed in the space between the plurality of partition walls 113 includes a phosphor, each of the plurality of partition walls 113 may be formed to have a height of 20 μm or more.

The plurality of partition walls 113 according to an embodiment are formed by etching of the growth substrate to form the plurality of LEDs 111. Specifically, the plurality of partition walls 113 are a part of a plurality of protrusions formed by etching of the growth substrate, wherein the plurality of protrusions are formed before a plurality of semiconductor layers included in the plurality of LEDs 111 are grown on the growth substrate. That is, the plurality of partition walls 113 according to an embodiment are not formed through a separate process after manufacturing of the LED device 111, but are formed on the basis of the etching of the growth substrate performed before the plurality of semiconductor layers included in the LED device 111 are grown on the growth substrate. The process of forming the plurality of partition walls 113 is described below with reference to FIGS. 2A to 2B, 3A to 3B, and 4A to 4H.

The reflector layer 114 is formed on both sides of each of the plurality of partition walls 113. The reflector layer 114 reflects the light emitted from the LED device 111 so as not to be absorbed by the partition wall 113, thereby improving the light extraction efficiency (LEE) of the LED device 111. The reflector layer 114 may be composed of or include at least one of aluminum (Al) and aluminum nitride (AlN), but the material of the reflector layer 114 according to the disclosure is not limited to a particular material. The process of forming the reflector layer 114 is described below with reference to FIGS. 2A to 2B, 3A to 3B, and 4A to 4H.

Specifically, the reflector layer 114 may be formed of an aluminum layer that is formed during epi growth by in-situ processing. In addition, the reflector layer may include a plurality of layers, and the outermost layer may include aluminum. For example, the reflector layer 114 may be composed of a multi-layer in a loop-layer structure including a first reflector layer of aluminum, a second reflector layer formed on the first reflector layer and made of aluminum nitride, and a third reflector layer formed on the second reflector layer and made of aluminum.

As another example, the reflector layer 114 may include a first reflector layer made of aluminum, a second reflector layer formed on the first reflector layer and made of sequentially stacked aluminum nitride, AlxGa1-xN (general formula: 0=x<1) and aluminum nitride, and a third reflector layer formed on the second reflector layer and made of aluminum.

The thickness of the reflector layer 114 may be formed in several nanometers to dozens of nanometers. A material and thickness of the reflector layer 114 are not limited thereto.

It has been described that the reflector layer 114 is formed on both sides of each of the plurality of partition walls 113, but it is understood that the reflector layer 114 may be additionally formed on the both sidewalls of the LED device 111 and on an opposite surface of the light emitting surface of the LED device 111. In this case, the reflector layer 114 may be formed of a metal reflector or a distributed-Bragg-reflector structure.

As illustrated in FIG. 1, the LED device 111 according to an embodiment may be implemented as a flip-chip type in which a first electrode and a second electrode are disposed toward the opposite surface of the light emitting surface of the LEDs 111. The LED device 111 may be a micro LED device 111. Specifically, the LED device 111 may be a micro LED device 111 having a width and a height length greater than or equal to 1 μm and less than or equal to 100 μm.

Further, the display module 110 includes a driving circuit which is described below with reference to FIG. 7.

The display module 110 according to an embodiment may not only be implemented as a separate device, but may also be implemented as a unit for configuring the display panel. The plurality of display modules 110 may be connected in a matrix form to form one display panel. An example of a plurality of display modules 110 forming a display panel is described below with reference to FIG. 9B.

According to an embodiment as described above, since the plurality of partition walls 113 are formed based on a growth substrate of the LED device 111, such as silicon, the stiffness and/or strength of the partition wall 113 is remarkably improved compared to the partition wall formed of the photo resin as in a related-art. Accordingly, the stability of the weight load, the external pressure, or the like, which may be generated throughout a manufacturing process of the display module 110, may be expected. In addition, since the display module 110 according to an embodiment includes the reflector layer 114 formed on both sides of the partition wall 113, improvement of light-emitting efficiency is expected.

According to an embodiment, light-emitting efficiency may be further improved according to angles of the plurality of partition walls 113, which is described below with reference to FIGS. 2A and 2B.

Figure 2A:
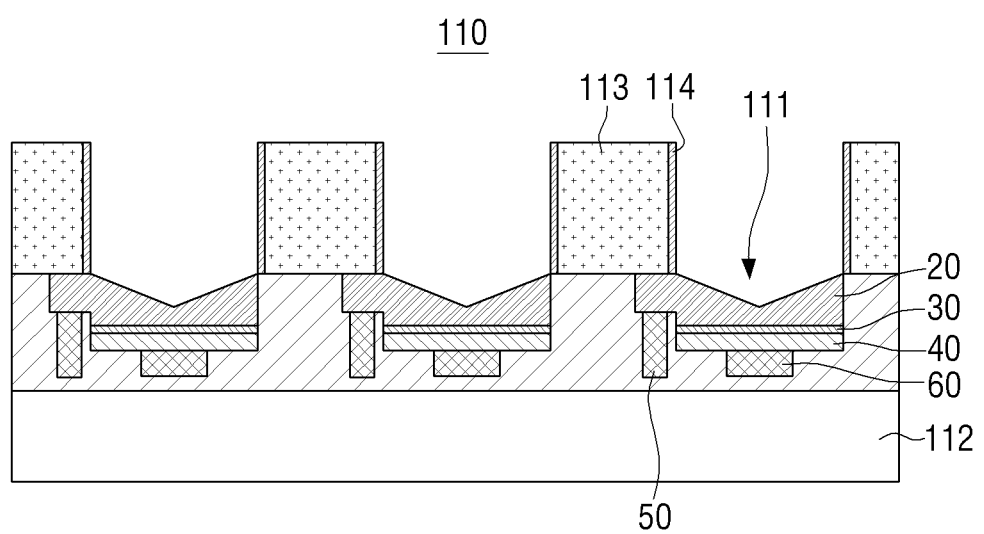
FIG. 2A is a cross-sectional diagram of a display module in which an angle of a partition wall is 90 degrees according to an embodiment.
Figure 2B:
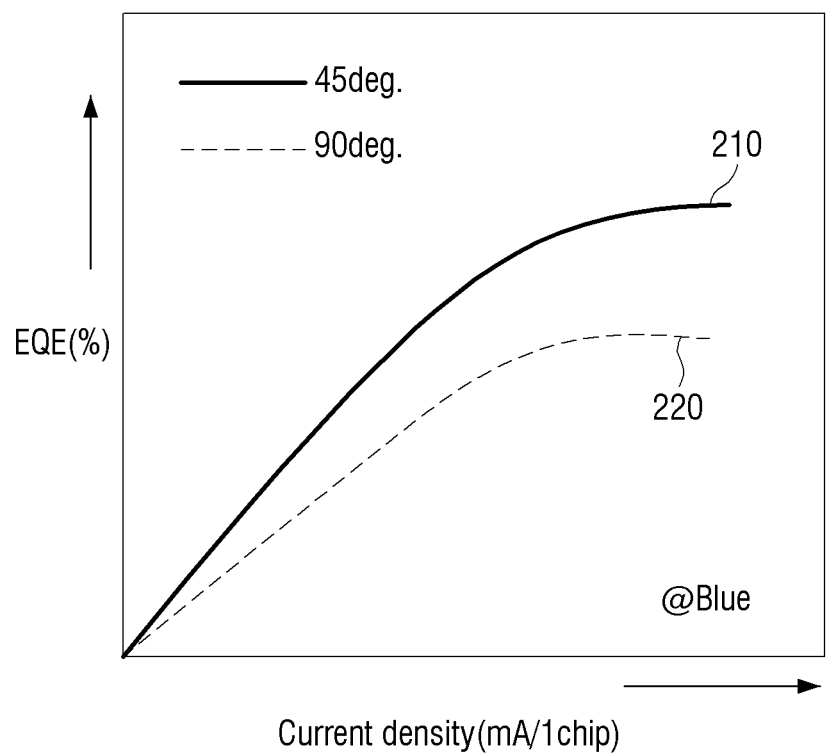
FIG. 2B is a diagram illustrating light-emitting efficiency according to an angle of a plurality of partition walls according to an embodiment.

FIGS. 2A and 2B are diagrams illustrating light-emitting efficiency according to an angle of a plurality of partition walls 113 according to an embodiment.

The angle of the plurality of partition walls 113 may be determined so that the plurality of partition walls 113 do not limit the light-emitting efficiency of the plurality of LEDs 111 according to the angle. Further, the angle of the plurality of partition walls 113 may be determined to improve light-emitting efficiency. The reflector layer 114 is formed on both sides of the plurality of partition walls 113 according to an embodiment and thus, the angle of the plurality of partition walls 113, and the angle of the reflector layer 114 may have a large effect on the light-emitting efficiency.

According to an embodiment, the width of each of the plurality of partition walls 113 narrows toward an upper portion. In this case, the width of each of the plurality of partition walls 113 (or barrier ribs) narrowing toward the upper part thereof may mean that an angle between the lower surface of the partition wall 113 and both sides of the partition wall 113 is less than 90 degrees with respect to a cross-section of the partition wall 113. Hereinafter, the angle between the lower surface of the partition wall 113 and both sides of the partition wall 113 is referred to as an angle of the partition wall 113 with respect to the cross-section of the partition wall 113.

If the angle of the partition wall 113 exceeds 90 degrees, the width of the light-emitting surface of the LED device 111 becomes narrower toward the upper portion, thereby reducing the light extraction efficiency (LEE) of the LED device 111. Thus, the angle of each of the plurality of partition walls 113 according to an embodiment may be less than 90 degrees, as illustrated in FIG. 1.

FIG. 2A illustrates a cross-sectional diagram of the display module 110 in which the angle of the partition wall 113 is 90 degrees. FIG. 2B is a graph showing external quantum efficiency (EQE) when the angle of the partition wall 113 is 45 degrees 210 and the angle of the barrier rib 113 is 90 degrees 220, respectively. The EQE is defined as the number of emitted photons being divided by the number of electrons injected, and is a function of the internal quantum efficiency (IQE) and light extraction efficiency of the LED device 111. The light-emitting efficiency of the LED device 111 varies depending on the internal quantum efficiency and the external quantum efficiency.

As illustrated in FIG. 2B, when the angle of the partition wall 113 is 45 degrees 210, the external quantum efficiency of the LED device 111 is improved compared to the case 220 where the angle of the barrier rib 113 is 90 degrees. The more the angle of the partition wall 113 is reduced from 90 degrees to 45 degrees, the more external quantum efficiency of the LED device 111 increases. Thus, the angle of the partition wall 113 according to one or more embodiments approaches 45 degrees.

As described above with reference to FIG. 1, and described in detail below with reference to FIGS. 3A to 3B and 4A to 4H, the plurality of partition walls 113 according to an embodiment may be formed based on a plurality of protrusions formed before a plurality of semiconductor layers included in the LED device 111 are grown on the growth substrate. Accordingly, the angle of the partition wall 113 as described above with reference to FIGS. 2A and 2B is also determined during the manufacturing process of the LED device 111.

Although the above description is with respect to the angle of the plurality of partition wall 113, it is assumed that the reflector layer 114 formed on both sides of the plurality of partition walls 113 has a layer structure, so that the angle of the plurality of partition walls 113 and the angle of the reflector layer 114 correspond to each other. According to another embodiment, the angle of the partition wall 113 may itself be 90 degrees, and the reflector layer 114 formed on both sides of the plurality of partition walls 113 may have an angle of less than 90 degrees. In other words, the reflector layer 114 and a plurality of layers included in the reflector layer may be formed to become narrower toward the upper portion.

The method of manufacturing the display module 110 and an effect thereof will now be described below.

Figure 3A:
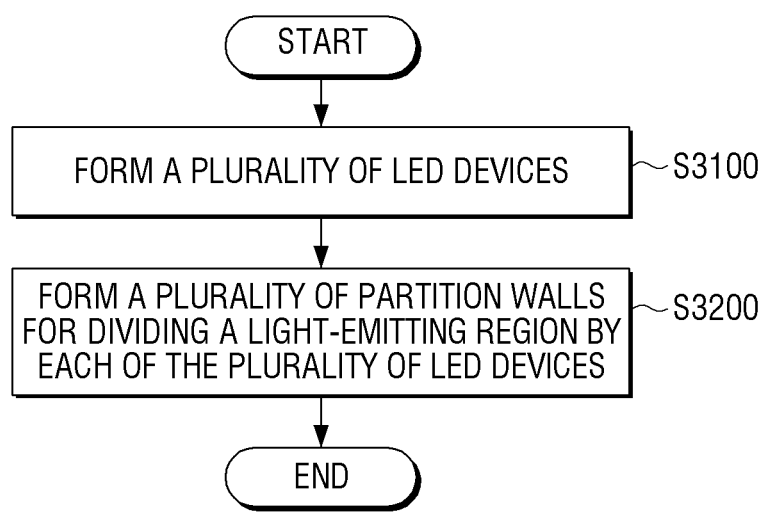
FIG. 3A is a flowchart briefly illustrating a method for manufacturing a display module according to an embodiment.

FIG. 3A is a flowchart briefly illustrating a method for manufacturing the display module 110 according to an embodiment; FIG. 3B is a flowchart illustrating each operation of FIG. 3A in greater detail. FIGS. 4A to 4H and 5A to 5C are cross-sectional diagrams illustrating each operation of a method for manufacturing the display module 110 according to an embodiment.

Reference will now be made to FIGS. 4A to 4H and 5A to 5C along with FIGS. 3A and 3B. Since the configurations included in the display module 110 and the functions thereof have been described in detail with reference to FIG. 1, a detailed description may not be repeated below. In FIGS. 4A to 4H, a reference number is marked only for a configuration or a space formed in the corresponding step, to clarify the configurations formed in each operation.

As illustrated in FIG. 3A, a method of manufacturing the display module 110 according to an embodiment includes forming a plurality of LEDs 111 in operation S3100 and forming a plurality of partition walls 113 for dividing a light emitting region by each of the plurality of LEDs 111 in operation S3200. The forming the plurality of LEDs 111 in operation S3100 includes a plurality of operations S3110 to S3170 as shown in FIG. 3B. In addition, the forming the plurality of partition walls 113 in operation S3200 may be performed in the same manner as operation S3210 of FIG. 3B.

Figure 4A:
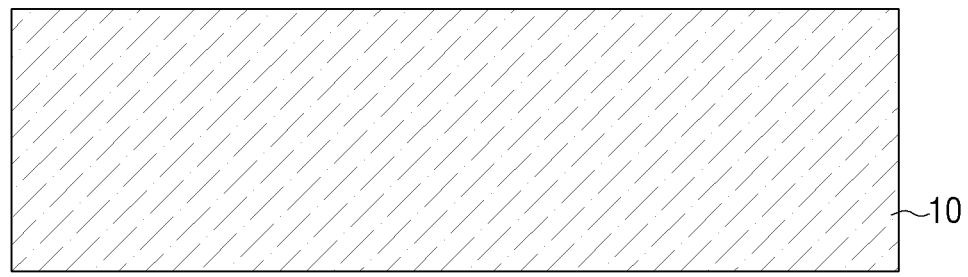
FIGS. 4A to 4H and 5A to 5C are cross-sectional diagrams illustrating each operation of a method for manufacturing a display module according to an embodiment.

FIG. 4A illustrates a growth substrate 10 for forming the LED device 111 according to an embodiment. The growth substrate 10 may be a material suitable for the growth of a semiconductor, a carrier wafer, or the like. The growth substrate 10 may be made of a material such as silicon (Si) or sapphire ($Al_2SO_4$), but may also be made of a material such as SiC, GaN, GaAs, ZnO, or the like.

The growth substrate 10 according to an embodiment is preferably composed of silicon (Si). As described below, in the case of the silicon growth substrate 10, it is easy to etch the growth substrate 10 such that each of the plurality of partition walls 113 is formed to a predetermined height so that the wavelengths of light emitted by each of the plurality of LED light emitting elements 111 do not overlap each other. However, the growth substrate 10 used in the disclosure is not limited to the growth substrate 10 of a particular material.

Figure 4B:
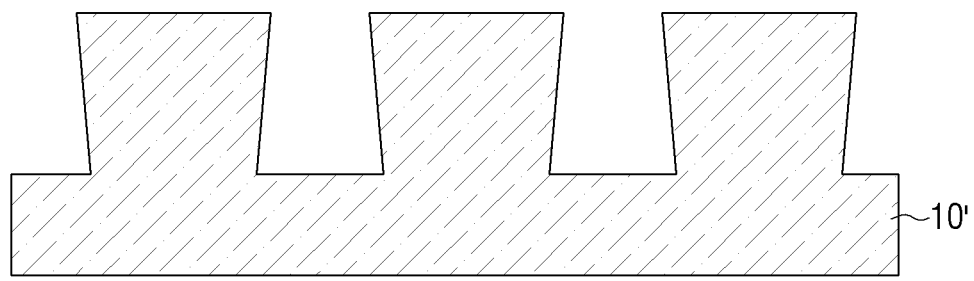

When the growth substrate 10 is provided, as illustrated in FIG. 4B, the growth substrate 10 for forming the plurality of LEDs 111 is etched in operation S3110. Specifically, the growth substrate 10 for forming the plurality of LEDs 111 is etched to form a plurality of depressions and a plurality of protrusions corresponding to the plurality of depressions, on the growth substrate 10. In other words, if the growth substrate 10 is provided, a growth substrate 10' having a so-called patterned sapphire/silicon substrate (PSS) structure is formed before the plurality of semiconductor layers are grown on the growth substrate 10 The growth substrate 10' of the PSS structure may refer to forming a pattern of a predetermined shape on the surface of the growth substrate 10 for forming the LED device 111. If a semiconductor layer is grown on the PSS structure growth substrate 10', crystal defects and internal total reflection may be reduced as compared to a case of growing on a planar growth substrate. Accordingly, it is possible to increase light-emitting efficiency. Forming the PSS structure may be performed mainly using an etching technique such as dry plasma etching, but is not limited to a specific process technology. A specific form of the PSS structure is not limited to a particular type, either.

In the disclosure, the etching of the growth substrate 10 to form the plurality of LEDs 111 is characterized in that a plurality of partition walls 113 are formed based on the etching. As described below with reference to FIG. 4H, a plurality of partition walls 113 are formed based on the plurality of protrusions formed by etching, and a space between the plurality of partition walls 113 is formed based on the plurality of depressions formed by etching together with a plurality of protrusions.

Therefore, the etching of the growth substrate 10 according to an embodiment may be performed in consideration of the height and angle of the plurality of partition walls 113. The etching of the growth substrate 10 may be performed such that each of the plurality of partition walls 113 have a predetermined height so that the wavelengths of light emitted by each of the plurality of LEDs 111 do not overlap with each other. Further, the etching of the growth substrate 10 may be performed such that the width of each of the plurality of barrier ribs 113 becomes narrower toward an upper portion.

Figure 4C:
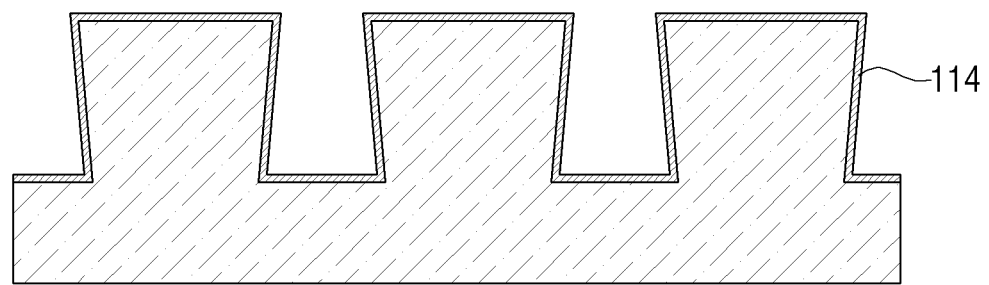

If the growth substrate 10 is etched, as illustrated in FIG. 4C, the reflector layer 114 are formed on the surfaces of a plurality of protrusions and a plurality of depressions in operation S3120. The reflector layer 114 may be formed of at least one of aluminum (Al) and aluminum nitride (AlN), and may have a thickness of several nanometers or tens of nanometers. However, the material and thickness of the reflector layer 114 are not limited thereto.

Specifically, the process of forming the reflector layer 114 may be performed by coating an entire part of an aluminum layer on the surface of the plurality of protrusions and the plurality of depressions, and then performing C+ axis orientation control to form an aluminum nitride layer such that the polar surface of aluminum may be formed on the outermost surface of the growth crystal, that is, the top surface of the plurality of protrusions formed on the growth substrate 10. Additionally forming an aluminum nitride layer on the top surface of the plurality of protrusions after the coating of the aluminum layer may be to adjust the polarity of the reflector layer 114 to facilitate horizontal growth of the n-type semiconductor layer 20 as described below. If the Al polarity is not actively controlled, the Al-polar and the N-polar are mixed to increase the threading dislocation density (TDD) and this may lead to degradation of the light-emitting efficiency.

However, the process of forming the reflector layer 114 according to the disclosure is not limited to the above-described process, and after the aluminum layer is entirely coated on the surface of the plurality of protrusions and the plurality of depressions, aluminum may be additionally formed on the upper surface of the plurality of protrusions formed on the growth substrate 10.

When (or based on) the partition wall 113 is formed as described below, the reflector layer 114 is disposed on both sides of the plurality of partition walls 113 on the display module 110, and reflects the light emitted from the LED device 111 so as not to be absorbed by the partition wall 113, thereby increasing the light extraction efficiency (LEE) of the LED device 111.

The reflector layer 114 may be formed of an aluminum layer that is formed during epi growth using in-situ process. In addition, the reflector layer may include a plurality of layers, and the outermost layer may be formed of aluminum. For example, the reflector layer 114 may be formed of a loop-layer structure multi-layer including a first reflector layer of aluminum, a second reflector layer formed on the first reflector layer and made of aluminum nitride, and a third reflector layer formed on the second reflector layer and made of aluminum.

As another example, the reflector layer 114 may include the first reflector layer made of aluminum, the second reflector layer formed on the first reflector layer and made of sequentially stacked aluminum nitride, AlxGa1-xN (general formula:0=x<1) and aluminum nitride, and a third reflector layer formed on the second reflector layer and made of aluminum.

Figure 4D:
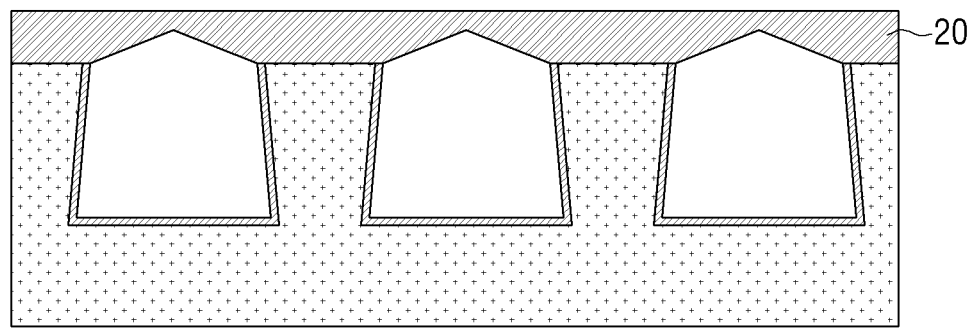

When the reflector layer 114 is formed, as illustrated in FIG. 4D, the n-type semiconductor layer 20 is grown in the horizontal direction on the reflector layer 114 formed on the upper surface of the plurality of protrusions in operation S3130. The n-type semiconductor layer 20 may be an AlxGayN (1≥x≥0, x+y=1) layer. When the n-type semiconductor layer 20 is grown in the horizontal direction on the reflector layer 114 formed on the upper surface of the plurality of protrusions, the upper portion of the plurality of depressions is closed by the grown n-type semiconductor layer 20. Here, the shape formed by the closing of the depressions is not limited to the shape shown in FIGS. 1 and 4D, or the like.

The horizontal growth process of the n-type semiconductor layer 20 may be performed by an epitaxial lateral overgrowth (ELO) technique. The horizontal epi growth technique is a technique for growing a semiconductor layer in a horizontal direction to reduce crystal defects such as a threading dislocation due to a lattice constant difference between the growth substrate 10 and the semiconductor layer.

As described above, when the aluminum nitride layer is additionally formed on the upper surface of the plurality of protrusions formed on the growth substrate 10 after coating the aluminum layer, the polarity of the reflector layer 114 is adjusted to facilitate horizontal growth of the n-type semiconductor layer 20. However, it is understood that one or more other embodiments are not limited thereto. For example, according to another embodiment, it is also possible to grow the n-type semiconductor layer 20 in a horizontal direction after the aluminum layer is additionally formed on the upper surface of the plurality of protrusions formed on the growth substrate 10 after the aluminum layer is formed.

Figure 4E:
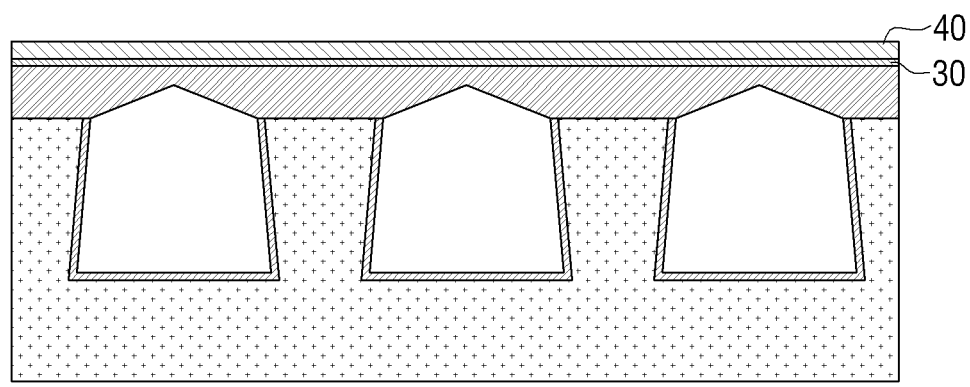

When the n-type semiconductor layer 20 is grown in the horizontal direction, the n-type semiconductor layer 20 is re-grown in operation S3140. When the n-type semiconductor layer is grown, as illustrated in FIG. 4E, the light-emitting layer 30 and the p-type semiconductor layer 40 are formed on the n-type semiconductor layer 20 in operation S3150. The process of forming the n-type semiconductor layer 20, the p-type semiconductor layer 40, and the light-emitting layer 30 may be performed by a technique such as metal organic chemical vapor deposition (MOCVD), metal organic chemical vapor phase epitaxy (MOVPE), molecular beam epitaxy (MBE), or the like.

Figure 4F:
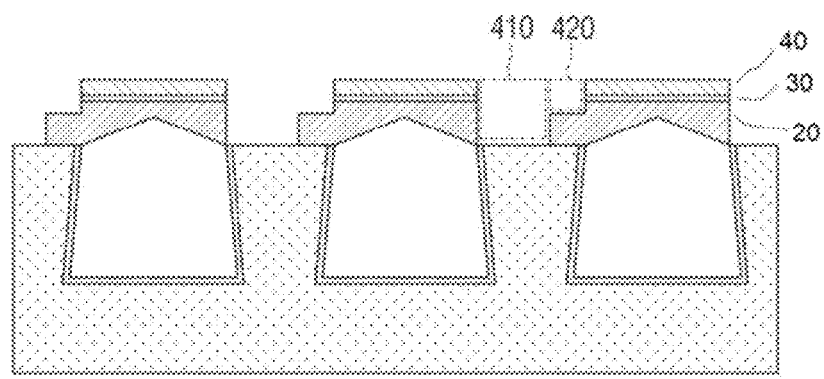

When the light-emitting layer 30 and the p-type semiconductor layer 40 are formed, as shown in FIG. 4F, the n-type semiconductor layer 20, the light-emitting layer 30, and the p-type semiconductor layer 40 are etched to form a region 410 for separating each of the plurality of LEDs 111 and a region 420 for disposing the n-type electrode 50 in operation S3160. Specifically, the region to be etched may be patterned by a photoresist process prior to etching, and the etching may be performed using wet etching or dry etching techniques. For example, the etching may be performed using dry etching techniques such as reactive ion etching (RIE), electro-cyclotron resonance (ECR), inductively coupled plasma reactive ion etching (ICP)-RIE, chemically assisted ion-beam etching (CAIBE), or the like.

Figure 4G:
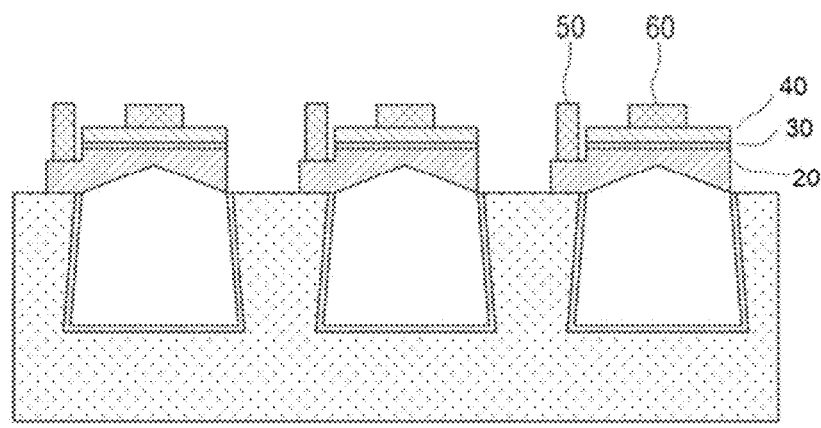

If a region for separating each of the plurality of LEDs 111 and a region for disposing the n-type electrode 50 are formed, the n-type electrode 50 electrically connected to the n-type semiconductor layer 20 is formed on the region 420 for disposing the n-type electrode 50, and the p-type electrode 60 electrically connected to the p-type semiconductor layer 40 is formed on the p-type semiconductor layer 40, as shown in FIG. 4G in operation S3170. The n-type electrode 50 and the p-type electrode 60 may be formed by a variety of processing techniques, such as sputtering, evaporation, and spin coating on electrode materials such as Al, Ti, Ni, Pd, Ag, Au, Au, and indium-tin-oxide (ITO) and ZnO.

Figure 4H:
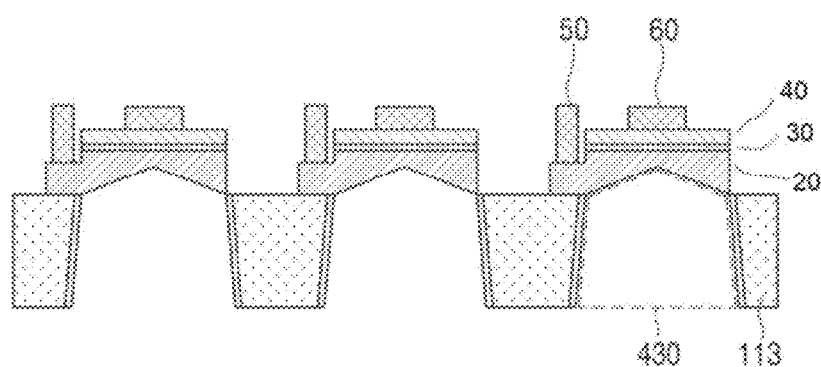

As shown in FIG. 4H, when (or based on) the plurality of LEDs 111 are formed according to the plurality of steps S3110 to S3170 as described above, a portion of the growth substrate 10 is removed to form a plurality of partition walls 113 in operation S3210. Specifically, the formation process of the plurality of partition walls 113 may be performed by a process of removing a portion of the growth substrate 10 such that a plurality of partition walls 113 is formed based on the plurality of protrusions and a space between the plurality of partition walls 113 is formed based on the plurality of depressions. More specifically, the plurality of partition walls 113 may be formed by removing the growth substrate 10 from its bottom in the same state as FIG. 4G until a portion of the plurality of protrusions form the plurality of partition walls 113, and the plurality of depressions may form part of the space between the plurality of partition walls 113, as illustrated in FIG. 4H.

The process of removing the growth substrate 10 is performed while the reflector layer 114 is formed on the surface of the plurality of protrusions and the plurality of depressions formed on the growth substrate 10 and thus, the presence of the reflector layer 114 reduces the etching rate of the removal process of the growth substrate 10. As a result, the plurality of partition walls 113 and the reflector layer 114 remain without a separate additional process, and the forming the partition wall 113 is facilitated. In addition, as the etching rate is reduced by the reflector layer 114, damage to the LED device and the partition wall may be prevented in the process of removing the growth substrate 10.

The removing process of the growth substrate 10 is not performed by only a specific method in all embodiments. By way of example, the removing of the growth substrate 10 made of a material safe against a chemical solution, such as silicon or sapphire, may be performed by wet etching.

Figure 5A:
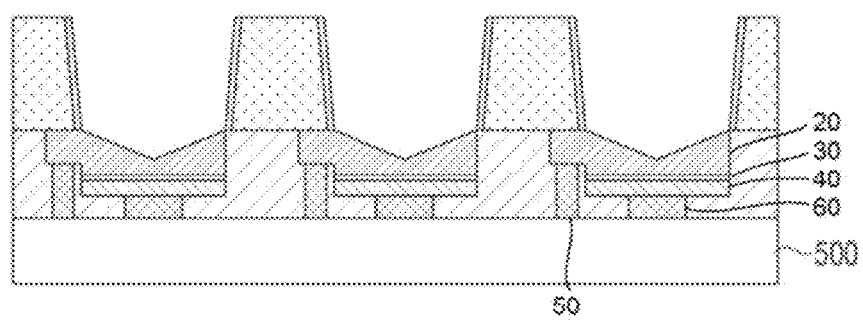
Figure 5B:
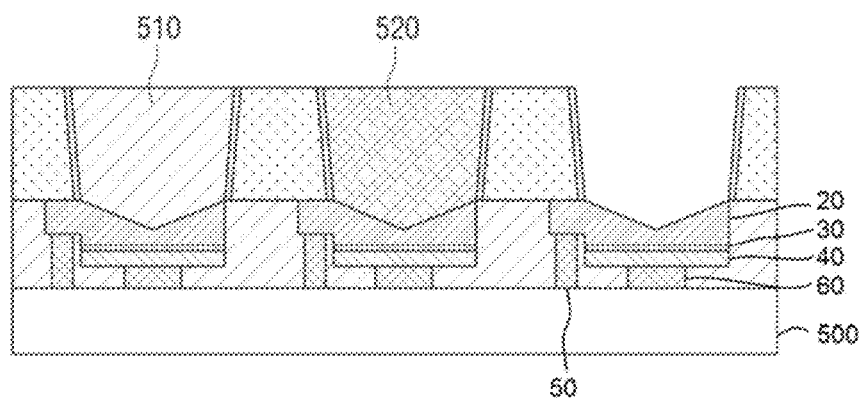
Figure 5C:
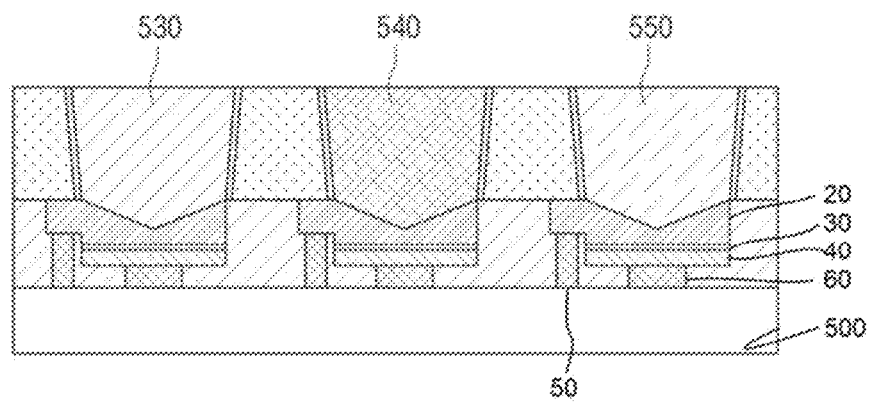

When the plurality of LEDs 111 is formed according to the plurality of steps S3110 to S3170 as described above, a plurality of LEDs 111 may be formed on a relay substrate 500, as shown in FIG. 5A, prior to finally forming the partition wall 113 by removing a portion of the growth substrate 10. If a process of forming the plurality of partition walls 113 and combining process of the relay substrate 500 is performed, as shown in FIGS. 5B or 5C, a color conversion layer may be formed in a space between the plurality of partition walls 113. The color conversion layer may include a quantum dot (QD) or a phosphor.

As illustrated in FIG. 5B, when (or based on) the plurality of LEDs are blue LEDs 111 emitting blue light, the color conversion layer may include a color conversion layer 510 for converting blue light emitted from the plurality of LEDs 111 into red light, and a color conversion layer 520 for converting the emitted blue light into green light. In this case, a color conversion layer for converting a plurality of LEDs emitting blue light into blue light is not required, as the plurality of LEDs emitting blue light.

As illustrated in FIG. 5C, if the plurality of LEDs are LED devices 111 that emit ultraviolet rays, the color conversion layer may include a color conversion layer 530 for converting the ultraviolet light emitted from the plurality of LEDs 111 into red light, a color conversion layer 540 for converting the emitted ultraviolet light into green light, and a color conversion layer 550 for converting the emitted ultraviolet light into blue light.

If a color conversion layer is formed, a color filter (CF), a protection layer, or the like, are formed on the color conversion layer, encapsulation is performed, and a packaging process of a chip scale is completed.

In the case of forming a plurality of configurations that are mutually equal to each other such as forming the n-type electrode 50 and the p-type electrode 60 as described above, there is no time-series element between the two operations. In addition, the order of the manufacturing method as described above may vary within a scope for achieving the objectives of the disclosure.

According to various embodiments as described above, by forming a plurality of partition walls 113 based on the etching of the growth substrate 10 to form the LED device 111, the process of forming the partition wall 113 is significantly simplified compared to the deposition using a related art photo-resin, and process costs may be reduced.

According to the related art, after forming the LED device 111, the processes of performing photolithography, exposure, developing, or the like, and then the forming of a black matrix, or the like, are required. Meanwhile, according to one or more embodiments, a plurality of partition walls 113 may be formed by etching the growth substrate 10 for forming the LED device 111 and removing a portion of the growth substrate 10 performed after the LED device 111 is formed. The presence of the reflector layer 114 formed on the side surface of the partition wall 113 causes the etching rate of the removing process of the growth substrate 10 to be varied, and the partition wall 113 and the reflector layer 114 remain without a separate additional process. Therefore, the process of forming the partition wall 113 may be further facilitated.

According to an embodiment, spacing between the plurality of LEDs 111 on the display module 110 is not determined depending solely on the transfer process, but may also be determined through the process of performing the etching of the growth substrate 10 in consideration of the spacing between the plurality of LEDs 111. Considering this point and the packaging process of the chip scale performed thereafter, minimization of the size of a device and improvement of the contrast ratio may be expected.

Figure 6:
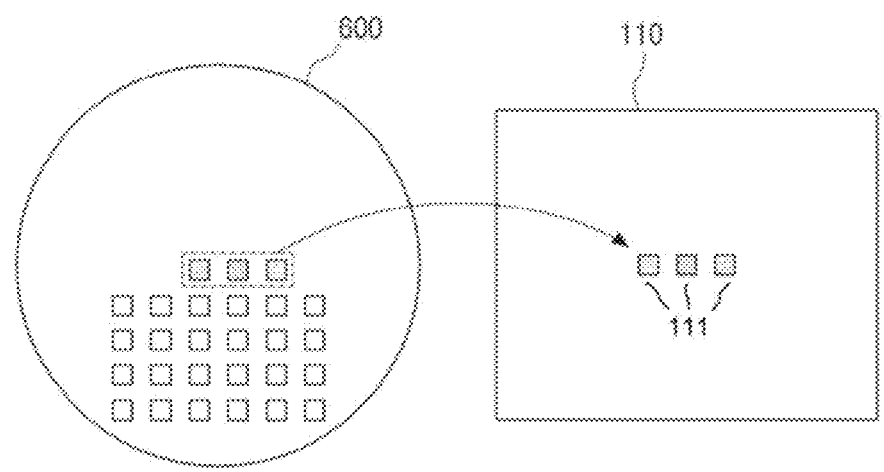
FIG. 6 is a diagram briefly illustrating a process for transferring an LED chip on a driving substrate according to an embodiment.

FIG. 6 is a diagram briefly illustrating a process for transferring an LED chip on a driving substrate according to an embodiment.

As described above, when the LED device 111 is manufactured and the chip scale packaging process including the LED device 111 is completed, a process of transferring the plurality of formed chips to the driving substrate is performed. The transfer process according to various embodiments may be performed through various methods such as, but not limited to, an electrostatic method, a stamp method, a printing method, a metal bonding method, or the like.

In the process of manufacturing the display module 110 including the LED device 111, improving the accuracy and efficiency of the transfer process is beneficial because the transfer process and, specifically, a process of precisely transferring a large number of microchips to the drive substrate, is important to implement the micro LED display.

According to an embodiment, the spacing between the plurality of LEDs 111 is determined according to the spacing between the plurality of partition walls 113, and the spacing between the plurality of partition walls 113 is determined in the process of forming a plurality of protrusions and a plurality of depressions by etching the growth substrate for the formation of the LEDs 111. Therefore, according to an embodiment, after etching the growth substrate in consideration of the spacing between the plurality of LEDs 111, if the process of forming the LED device 111 as described above and the packaging process of the chip scale are performed, the accuracy and efficiency of the transfer process performed thereafter may be significantly improved.

For example, according to an embodiment, a transfer process may be performed on a chip-by-chip basis including three LEDs 111 as shown in FIGS. 5B or 5C. As illustrated in FIG. 6, by transferring the chips including three LEDs corresponding to an R sub-pixel, a G sub-pixel, and a B sub-pixel to the driving substrate on a chip-by-chip basis, the transfer process in a pixel unit is possible. By way of another example, by performing the transfer process on a line-by-line basis, it is possible to transfer lines corresponding to each of the R sub-pixel, the G sub-pixel, and the B sub-pixel to the driving substrate adjacent to each other, and to configure one pixel with the neighboring R sub-pixel, the G sub-pixel, and the B sub-pixel.

Hereinafter, with reference to FIG. 7, a process of forming the LED device 111, a process of packaging of the chip scale, and a specific process of the display module 110 manufactured by performing the transfer process, or the like, is described.

Figure 7:
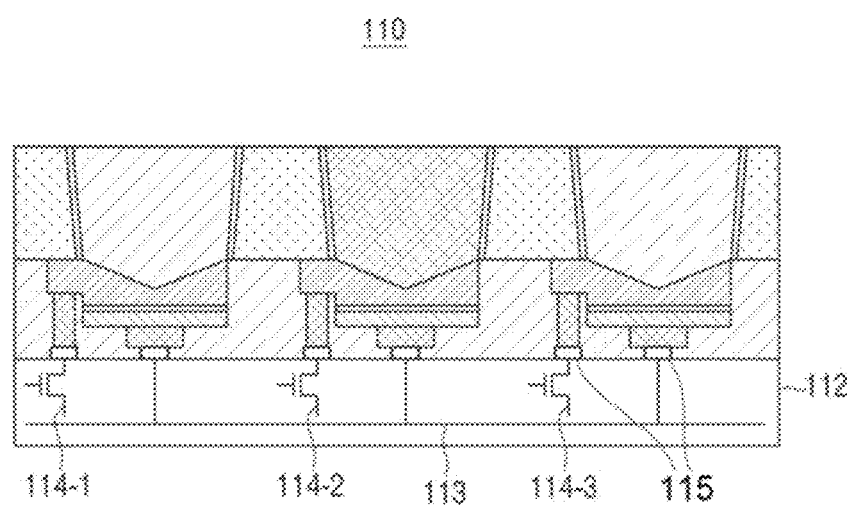
FIG. 7 is a diagram illustrating a structure of a display module according to an embodiment.

FIG. 7 is a diagram illustrating a structure of the display module 110 according to an embodiment.

As illustrated in FIG. 7, the display module 110 according to an embodiment includes the plurality of LEDs 111 and the driving substrate 112. The driving substrate 112 may include a driving circuit. The driving circuit may be configured separately from the driving substrate 112.

The driving circuit is a circuit for driving a plurality of LEDs 111. Specifically, the plurality of LEDs 111 may be mounted on the driving substrate 112 including a driving circuit, and may be electrically connected to each of the driving circuits. Further, a driving circuit according to an embodiment may be disposed on an upper portion of the driving substrate 112. In other words, according to an embodiment, a driving circuit may be formed (or provided) on the driving substrate 112, and a plurality of LEDs may be formed (or provided) on the driving circuit. The driving of the display module 110 according to an embodiment may be performed in the active matrix manner, and the driving substrate 112 and the driving circuit may be designed to be suitable to the driving method. Another embodiment may also be applied to a passive matrix method.

The driving circuit may include a plurality of switching devices together with a plurality of electrode pads 115, a plurality of circuit elements, or the like. The switching device is a semiconductor device configured to control the driving of the plurality of LEDs 111 included in the display module 110, and serves as a kind of switch for individual pixels of the display device 100. As shown in FIG. 7, a thin film transistor (TFT) 114-1, 114-2, and 114-3 may be used as the switching device.

The n-type electrodes included in the plurality of LEDs 111 are connected to the electrode pads 115 in the form of a common electrode, and the p-type electrodes may be individually connected to each of the pixel electrodes. Accordingly, the light emission of each of the plurality of LEDs 111 may be individually controlled.

Figure 8:
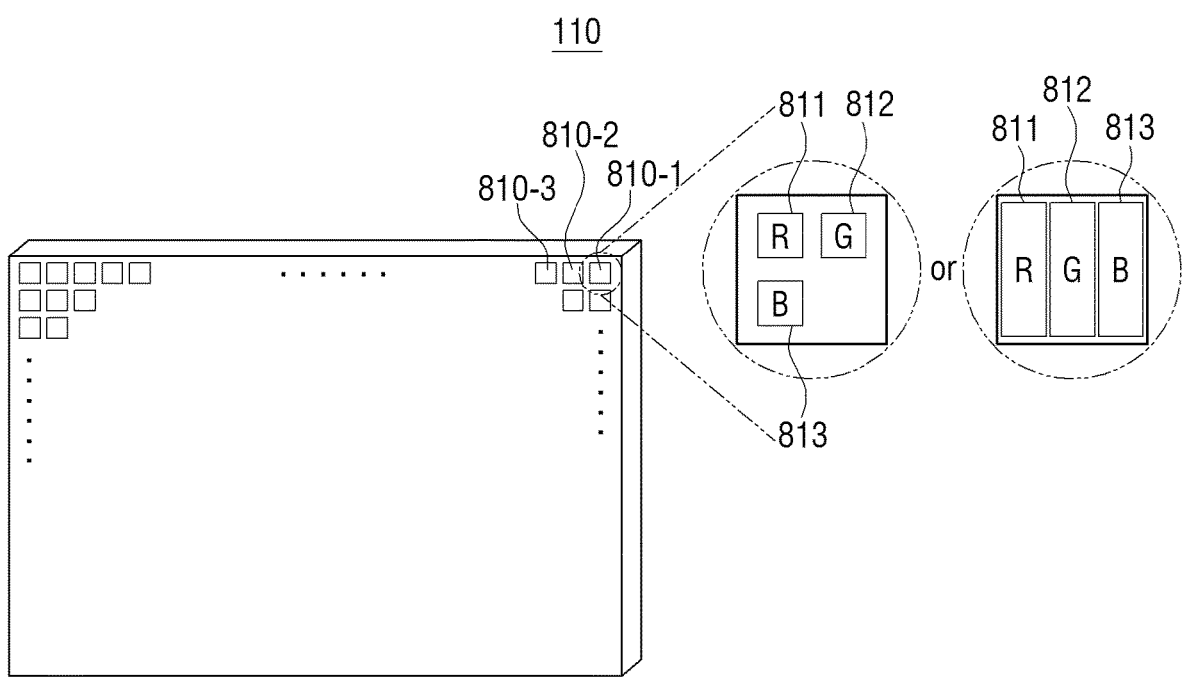
FIG. 8 is a diagram illustrating a configuration of a display module according to an embodiment.

FIG. 8 is a diagram illustrating a configuration of a display module 110 according to an embodiment.

As illustrated in FIG. 8, the display module 110 according to an embodiment may include a plurality of pixels 810-1, 810-2, 810-3 arranged in a matrix form, and the plurality of pixels 810-1, 810-2, 810-3 may each include an R sub-pixel 811, a G sub-pixel 812, and a B sub-pixel 813. Although FIG. 8 illustrates an example in which a plurality of sub-pixels are arranged in a form of 2×2 in one pixel, and a plurality of sub-pixels are arranged in a form of 3×1 in one pixel, it is understood that this is just an example and one or more other embodiments are not limited thereto.

The R sub-pixel 811, the G sub-pixel 812, and the B sub-pixel 813 may each correspond to the LED devices 111. That each of the sub-pixels 811, 812, 813 corresponds to the LED device 111 may mean that each of the sub-pixels 811, 812, and 813 may be implemented by driving of the LED device 111.

The configurations of the pixels and sub-pixels of the display module 110 described with reference to FIG. 8 are considered in performing packaging process and transfer process, or the like, of a chip scale, as described above.

Figure 9A:
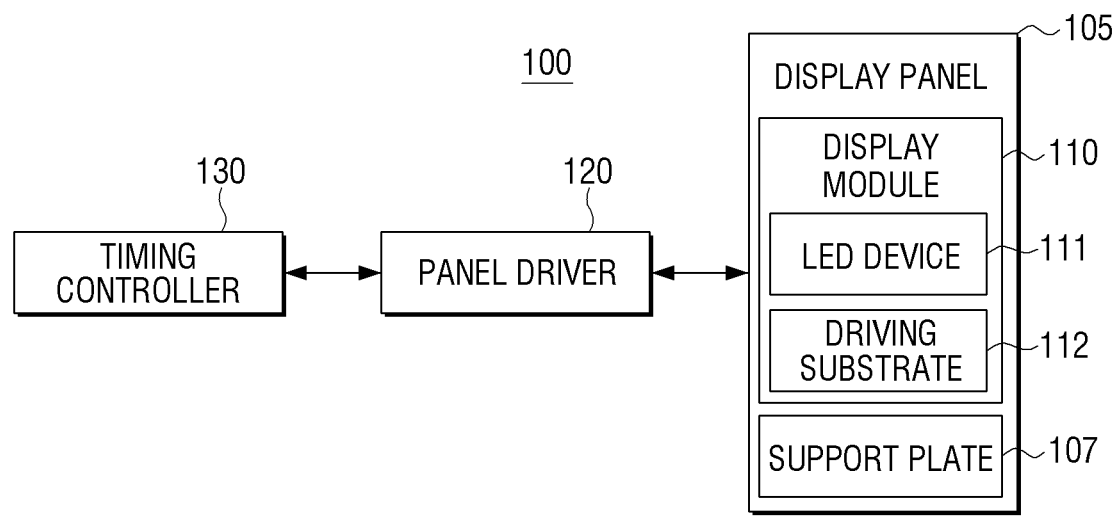
FIG. 9A is a block diagram illustrating a simple configuration of a display apparatus including a display module according to an embodiment.
Figure 9B:
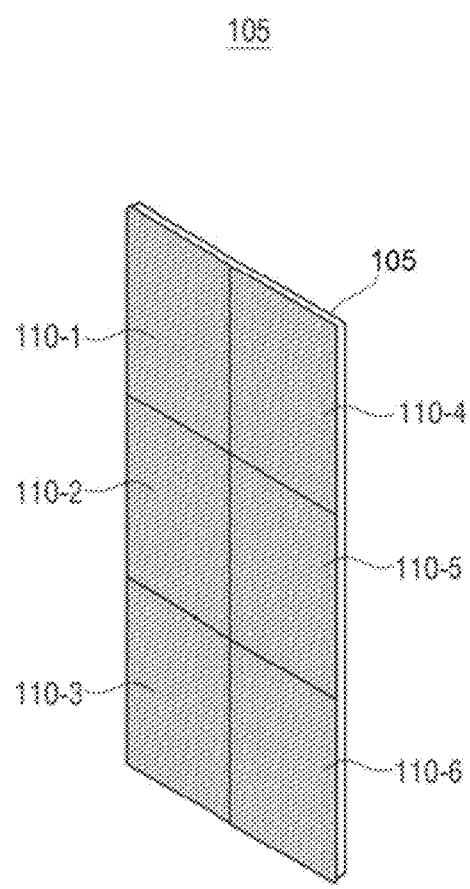
FIG. 9B is a diagram illustrating a configuration of a display panel according to an embodiment.

FIG. 9A is a block diagram illustrating a simple configuration of a display device 100 according to an embodiment and FIG. 9B is a diagram illustrating a configuration of a display panel according to an embodiment.

The display device 100 according to an embodiment may be implemented by at least one of a television (TV), a monitor, a smartphone, a laptop computer, a desktop computer, a portable multimedia player, and a wearable device. Any type of device capable of displaying visual information through the display module 110 may be included in the display device 100 according to the disclosure.

Referring to FIG. 9A, the display device 100 according to an embodiment includes a display panel 105, a panel driver 120, and a timing controller 130.

The display panel 105 displays an image under the control of the panel driver 120. The display panel 105 includes a plurality of display modules 110 and a support plate 107. The display module 110 has been described above with reference to FIGS. 1, 2A to 2B, 3A to 3B, 4A to 4H, 5A to 5C, and 6 to 8.

The support plate 107 supports the plurality of LED modules 110 so that the plurality of LED modules 110 connected to each other may form one display panel 105. The structure of the plurality of LED modules 110 forming one display panel 105 through the support plate 107 is described below with reference to FIG. 9B.

The panel driver 120 includes a plurality of driver integrated circuits (ICs), and the display module 110 controls the driving of the display panel 105 or the display panel 105 through the plurality of driving ICs. Specifically, the plurality of driving ICs included in the panel driver 120 may control the light emission of the plurality of LEDs 111 connected to each of the driving circuits by driving the driving circuit included in the driving substrate 112.

The timing controller 130 controls the panel driver 120. Specifically, the timing controller 130 may adjust the image data signal to a signal required by the panel driver 120 and transmit the adjusted signal to the panel driver 120. The timing controller 130 may be referred to in the art as a timing controller (T-CON), a data hub, a receiving card, a controller, or the like, but it should be understood that the timing controller 130 may be applied to the disclosure without limiting its name but based on a configuration that may control the panel driver 120 within a range that may accomplish the objectives of the disclosure.

As described above, the plurality of LEDs 111 are individually connected to the driving circuit, and light emission of each of the plurality of LEDs 111 may be individually controlled according to the control of the timing controller 130 and the panel driver 120.

Further, the display device 100 according to an embodiment may also include a memory and at least one processor. The memory may store at least one command related to the control of the display device 100, software related to the operation of the display device 100, image data, or the like. The at least one processor may control the overall operation of the display device 100.

Referring to FIG. 9B, a display panel 105 according to an embodiment may include a plurality of display modules 110. Specifically, the plurality of display modules 110 may be connected in a matrix form to form one display panel 105. That is, the display module 110 according to an embodiment may not only be implemented as an independent device, but may also be implemented as a unit for configuring the display panel 105.

The support plate 107 supports the plurality of LED modules 110 so that the plurality of LED modules 110 connected to each other may form one display panel 105. As illustrated in FIG. 9B, the plurality of display modules 110-1, 110-2, 110-3, 110-4, 110-5, and 110-6 may form one display panel 105 through the support plate 107.

In FIG. 9B, it has been illustrated as an example that six display modules 110-1, 110-2, 110-3, 110-4, 110-5, and 110-6 are connected in a 3×2 format to form the display panel 105. It is understood that the disclosure is not limited to the number and arrangement format of the display module 100.

Figure 10A:
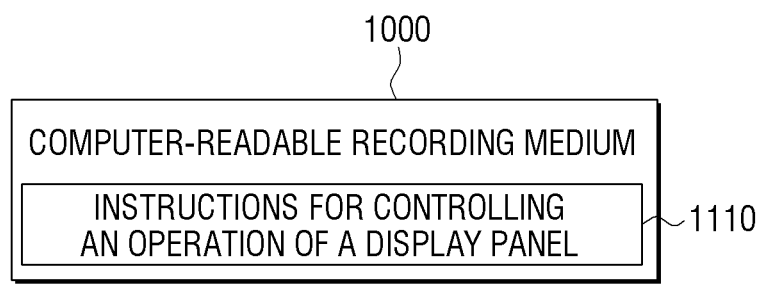
FIG. 10A is a diagram illustrating a computer-readable recording medium having instructions for performing each operation of a method for manufacturing a display module stored therein, according to an embodiment.
Figure 10B:
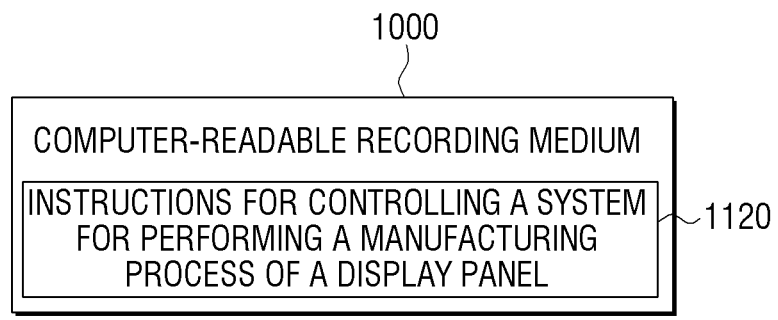
FIG. 10B is a diagram illustrating a computer-readable recording medium having instructions for performing each operation of a method for controlling a display module stored therein, according to an embodiment.

FIG. 10A is a diagram illustrating a computer-readable recording medium having instructions for performing each operation of a method for manufacturing the display module 110 stored therein, according to an embodiment; and FIG. 10B is a diagram illustrating a computer-readable recording medium having instructions for performing each operation of a method for controlling the display module 110 stored therein, according to an embodiment.

As described above, a method for controlling the display module 110 may be implemented as a program and provided to the display device 100. The method for manufacturing the display module 110 as described above may be implemented as a program and provided to a device performing a manufacturing process of the display module 110 or a system including a plurality of devices.

A program including a method for controlling the display device 100 or a method for manufacturing the display module 110 may be stored and provided in a non-transitory computer readable medium. The non-transitory computer readable medium refers to a medium that stores data semi-permanently rather than storing data for a very short time, such as a register, a cache, a memory or etc., and is readable by an apparatus. In detail, the aforementioned various applications or programs may be stored in the non-transitory computer readable medium, for example, a compact disc (CD), a digital versatile disc (DVD), a hard disc, a Blu-ray disc, a universal serial bus (USB), a memory card, a read only memory (ROM), and the like, and may be provided.

As illustrated in FIG. 10A, the computer readable medium 1000 may include at least one instruction 1110 for controlling an operation of the display module 110. As illustrated in FIG. 10B, the computer readable medium 1000 may include at least one instruction 1120 for controlling a system for performing a manufacturing process of the display module 110.

The computer-readable recording medium 1000 according to an embodiment may include instructions for controlling a system including a plurality of devices or devices for performing each step for forming a plurality of LEDs 111. In addition, the computer-readable recording medium 1000 may include instructions for controlling a manufacturing device or system for performing each of the steps involved in the manufacturing process of the display module 110, including steps for forming a plurality of partition walls.

For example, the computer-readable recording medium 1000 may include instructions for controlling an n-type semiconductor layer, a p-type semiconductor layer, and a metal organic chemical vapor deposition (MOCVD) device for growing the light-emitting layer included in the LED light-emitting device 111. By way of another example, the computer-readable recording medium 1000 may include instructions for controlling a device for etching a growth substrate or etching a plurality of semiconductor layers.

According to various embodiments of the disclosure as described above, since a plurality of partition walls are formed based on a growth substrate of an LED device such as silicon, the stiffness/strength of the partition wall is remarkably improved compared to a partition wall formed by a photo resin as in the related art. Accordingly, the stability of the weight load, the external pressure, etc., which may be generated in an overall manufacturing process of the display module 110, may be expected. The display module 110 according to an embodiment includes a reflector layer formed on both sides of the partition wall and thus, the light emitting efficiency may be improved. When the angle of the plurality of partition walls according to the disclosure is adjusted to be less than 90 degrees, such as close to 45 degrees, the light emitting efficiency may be further improved.

According to an embodiment, by forming a plurality of partition walls based on etching of a substrate to form the LED device, a process of forming a partition wall is remarkably simplified as compared to stacking using a related art photo-resin and thus, a process cost may be saved.

According to the related art, there is a need of processes such as forming an LED device, performing photolithography, exposure, developing, or the like, and then forming a black matrix, or the like. Meanwhile, according to an embodiment, a plurality of partition walls may be formed by a process of etching a substrate for forming an LED device and removing a part of a substrate after the LED device is formed.

In particular, the presence of the reflector layer formed on the side of the partition wall causes the etching rate of the removal process of the substrate to be varied, thereby making the forming of the partition wall easier, as the plurality of partition walls and the reflector layers remain without a separate additional process.

According to an embodiment, the spacing between the plurality of LEDs on the display module 110 may not be determined entirely based on the transfer process, but may also be determined through the process of performing the etching of the substrate taking into account the spacing between the plurality of LED elements. Considering this point and the packaging process of the chip scale performed thereafter, it is also possible to minimize the size of the device and improve contrast ratio.

According to an embodiment, after performing etching of the substrate in consideration of the spacing between a plurality of LEDs and performing a process of forming the LED device and a process of packaging of a chip scale, precision and efficiency of the transfer process performed thereafter may be remarkably improved.

In conclusion, according to various embodiments, the display module 110 including a high-performance partition wall, the display device 100, and an efficient method for manufacturing the display module 110 including a high-performance partition wall may be provided.

A display module according to the disclosure may be applied while being installed on a wearable device, a portable device, a handheld device, and various kinds of electronic products or electronic parts for which displays are needed as a single unit, or it may be applied to display devices such as a monitor for a personal computer (PC), a high resolution TV, signage, and an electronic display through a plurality of assembly arrangements as a matrix type.

Each of the components (for example, a module or a program) according to one or more embodiments may be composed of one or a plurality of objects, and some subcomponents of the subcomponents described above may be omitted, or other subcomponents may be further included in the embodiments. Alternatively or additionally, some components (e.g., modules or programs) may be integrated into one entity to perform the same or similar functions performed by each respective component prior to integration. Further, various features from various different embodiments may be combined.

Operations performed by a module, program, or other component, in accordance with embodiments, may be performed sequentially, in parallel, repetitive, or heuristic manner, or at least some operations may be performed in a different order, omitted, or other operations can be added.

While the disclosure has been shown and described above with reference to various embodiments, it will be understood by those skilled in the art that various changes in form and details may be made therein without departing from the spirit and scope of the disclosure as defined at least by the appended claims and their equivalents.

What is claimed is:

1. A display module comprising:
a plurality of light-emitting diodes (LEDs);
a driving substrate;
a driving circuit on an upper portion of the driving substrate and configured to drive the plurality of LEDs;
a plurality of partition walls configured to divide light-emitting regions by each of the plurality of LEDs; and
reflective layers formed on both sides of each of the plurality of partition walls,
wherein each of the plurality of partition walls is formed to have a predetermined height so that wavelengths of light emitted from each of the plurality of LEDs do not overlap each other, and
wherein a width of each of the plurality of partition walls narrows as a height increases toward an upper portion.

2. The display module of claim 1, wherein:
each of the plurality of partition walls is a part of a plurality of protrusions formed by etching of a growth substrate to form the plurality of LEDs; and
the plurality of protrusions is formed before a plurality of semiconductor layers included in the plurality of LEDs is formed on the growth substrate.

3. The display module of claim 2, further comprising:
a color conversion layer at a space between the plurality of partition walls,
wherein the space between the plurality of partition walls is formed based on a plurality of depressions formed along with the plurality of protrusions on the growth substrate, and
wherein the color conversion layer comprises a quantum dot (QD) or phosphor.

4. The display module of claim 1, further comprising:
a plurality of pixels in a matrix form,
wherein the plurality of pixels each comprise a red (R) sub pixel, a green (G) sub pixel, and a blue (B) sub pixel, and
wherein the R-sub pixel, the G-sub pixel, and the B-sub pixel each correspond to one LED device among the plurality of LEDs.

5. The display module of claim 1, wherein each of the plurality of partition walls comprises silicon.

6. The display module of claim 1, wherein the reflective layers each comprise at least one of aluminum (Al) and aluminum nitride (AlN).

7. The display module of claim 6, wherein the reflective layers comprise:
a first reflective layer comprising aluminum;
a second reflective layer on the first reflective layer and comprising aluminum nitride; and
a third reflective layer on the second reflective layer and comprising aluminum.

8. The display module of claim 1, wherein each of the plurality of LEDs is a micro LED device in a flip-chip type.

9. A method for manufacturing a display module, the method comprising:
forming a plurality of light emitting diodes (LEDs); and
forming a plurality of partition walls that divide light-emitting regions by each of the plurality of LEDs,
wherein the forming the plurality of LEDs comprises:
etching a growth substrate to form a plurality of LEDs and forming a plurality of protrusions and a plurality of depressions on the growth substrate; and
forming a reflector layer on a surface of the plurality of protrusions and a surface of the plurality of depressions, and
wherein the forming the plurality of partition walls comprises removing a part of the growth substrate so that the plurality of partition walls are formed based on the plurality of protrusions, and a space between the plurality of partition walls is formed based on the plurality of depressions.

10. The method of claim 9, wherein the forming the plurality of LEDs further comprises:
growing an n-type semiconductor layer on the reflector layer formed on a top surface of the plurality of protrusions in a horizontal direction;
re-growing the n-type semiconductor layer grown in the horizontal direction;
forming a light-emitting layer and a p-type semiconductor layer on the regrown n-type semiconductor layer;
forming a region for dividing each of the plurality of LEDs and a region for disposing an n-type electrode by etching the n-type semiconductor layer, the light-emitting layer, and the p-type semiconductor layer; and
forming the n-type electrode electrically connected to the n-type semiconductor layer on a region to dispose the n-type electrode, and forming, on the p-type semiconductor, a p-type electrode electrically connected to the p-type semiconductor.

11. The method of claim 9, wherein each of the plurality of partition walls are formed to have a predetermined height so that wavelengths of light emitted from each of the plurality of LEDs do not overlap each other.

12. The method of claim 9, wherein a width of each of the plurality of partition walls narrows as a height approaches toward an upper portion.

13. The method of claim 9, wherein each of the plurality of partition walls comprises silicon.

14. The method of claim 9, wherein the reflector layer comprises at least one of aluminum (Al) and aluminum nitride (AlN).

15. The method of claim 9, further comprising:
forming a color conversion layer at a space between the plurality of partition walls,
wherein the color conversion layer comprises a quantum dot (QD) or phosphor.

16. A display device comprising:
a plurality of display modules; and
a support plate configured to support the plurality of display modules,
wherein each of the plurality of display modules comprises:
a plurality of light-emitting diodes (LEDs);
a driving substrate;
a driving circuit on an upper portion of the driving substrate and configured to drive the plurality of LEDs;
a plurality of partition walls configured to divide light-emitting regions by each of the plurality of LEDs; and
reflective layers formed on both sides of each of the plurality of partition walls,
wherein each of the plurality of partition walls is a part of a plurality of protrusions formed by etching of a growth substrate to form the plurality of LEDs, and
wherein the plurality of protrusions is formed before a plurality of semiconductor layers included in the plurality of LEDs is formed on the growth substrate.

17. The display device of claim 16, wherein:
the display module further comprises a plurality of pixels in a matrix form,
the plurality of pixels each comprise a red (R) sub pixel, a green (G) sub pixel, and a blue (B) sub pixel, and
the R-sub pixel, the G-sub pixel, and the B-sub pixel each correspond to one LED device among the plurality of LEDs.

* * * * *